(12) United States Patent
Riverso et al.

(10) Patent No.: US 11,862,976 B2
(45) Date of Patent: Jan. 2, 2024

(54) GENERATION OF DEMAND RESPONSE EVENTS BASED ON GRID OPERATIONS AND FAULTS

(71) Applicant: CARRIER CORPORATION, Palm Beach Gardens, FL (US)

(72) Inventors: Stefano Riverso, Cork (IE); Marcello Torchio, Cork (IE)

(73) Assignee: CARRIER CORPORATION, Palm Beach Gardens, FL (US)

( * ) Notice: Subject to any disclaimer, the term of this patent is extended or adjusted under 35 U.S.C. 154(b) by 387 days.

(21) Appl. No.: 16/973,248

(22) PCT Filed: Aug. 1, 2019

(86) PCT No.: PCT/US2019/044645
§ 371 (c)(1),
(2) Date: Dec. 8, 2020

(87) PCT Pub. No.: WO2020/036745
PCT Pub. Date: Feb. 20, 2020

(65) Prior Publication Data
US 2021/0242682 A1    Aug. 5, 2021

Related U.S. Application Data

(60) Provisional application No. 62/718,517, filed on Aug. 14, 2018.

(51) Int. Cl.
*H02J 3/14* (2006.01)
*H02J 13/00* (2006.01)
(Continued)

(52) U.S. Cl.
CPC ............. *H02J 3/144* (2020.01); *G01R 31/50* (2020.01); *G05B 13/026* (2013.01);
(Continued)

(58) Field of Classification Search
CPC .......... H02J 3/144; H02J 3/0012; H02J 3/381; H02J 13/00006; H02J 3/003; H02J 3/004;
(Continued)

(56) References Cited

U.S. PATENT DOCUMENTS

| 8,234,017 B2 | 7/2012 | Ahn |
| 8,260,468 B2 | 9/2012 | Ippolito et al. |

(Continued)

FOREIGN PATENT DOCUMENTS

| CN | 107732977 A | 2/2018 |
| EP | 3098935 A1 | 11/2016 |

(Continued)

OTHER PUBLICATIONS

International Search Report and Written Opinion for Application No. PCT/US2019/044645, International Filing Date: Aug. 1, 2019, dated Oct. 8, 2019, 15 pages.

(Continued)

*Primary Examiner* — Ziaul Karim
(74) *Attorney, Agent, or Firm* — CANTOR COLBURN LLP

(57) ABSTRACT

Provided are techniques for predictively generating demand response (DR) events based on grid operations and faults, based on optimization and self-learning routines. The techniques include obtaining grid status information, and determining a fault condition based at least in part on the grid status information. The techniques also include generating a DR event based at least in part on the fault condition, and responsive to generating the DR event, transmitting a notification of the DR event.

10 Claims, 4 Drawing Sheets

(51) Int. Cl.
*G01R 31/50* (2020.01)
*H02J 3/00* (2006.01)
*G05B 13/02* (2006.01)
*H02J 3/38* (2006.01)

(52) U.S. Cl.
CPC ............ *H02J 3/0012* (2020.01); *H02J 3/381* (2013.01); *H02J 13/00006* (2020.01); *H02J 3/003* (2020.01); *H02J 3/004* (2020.01); *H02J 2300/24* (2020.01); *H02J 2300/28* (2020.01)

(58) Field of Classification Search
CPC ............... H02J 2300/24; H02J 2300/28; H02J 2203/20; G01R 31/50; G05B 13/026; Y02B 70/3225; Y02B 90/20; Y02E 10/56; Y02E 60/00; Y04S 10/50; Y04S 20/222; Y04S 40/12; Y04S 40/20; G06Q 10/06; G06Q 30/01; G06Q 50/06
See application file for complete search history.

(56) References Cited

U.S. PATENT DOCUMENTS

| | | | |
|---|---|---|---|
| 8,280,556 B2 | 10/2012 | Besore et al. | |
| 8,285,500 B2 | 10/2012 | Kreiss et al. | |
| 8,463,453 B2 | 6/2013 | Parsons, Jr. | |
| 9,606,520 B2 | 3/2017 | Noboa et al. | |
| 9,766,671 B2 | 9/2017 | Dorn et al. | |
| 2004/0034484 A1 | 2/2004 | Solomita, Jr. et al. | |
| 2010/0138363 A1 | 6/2010 | Batterberry et al. | |
| 2010/0262309 A1* | 10/2010 | Currie | H02J 3/007 700/291 |
| 2013/0110756 A1 | 5/2013 | Zhang et al. | |
| 2013/0253898 A1 | 9/2013 | Meagher et al. | |
| 2014/0277788 A1* | 9/2014 | Forbes, Jr. | H02J 3/14 700/286 |
| 2015/0052188 A1* | 2/2015 | Herberg | H04L 63/0428 709/203 |
| 2015/0310465 A1* | 10/2015 | Chan | G06Q 50/06 705/7.34 |
| 2016/0056759 A1* | 2/2016 | Pinneo | H02S 40/38 307/23 |
| 2017/0170685 A1 | 6/2017 | Taft | |
| 2018/0257473 A1* | 9/2018 | Follen | B60W 10/06 |
| 2018/0329442 A1* | 11/2018 | Hohm | G05F 1/66 |
| 2019/0125459 A1* | 5/2019 | Shelton, IV | G16H 40/63 |

FOREIGN PATENT DOCUMENTS

| | | |
|---|---|---|
| WO | 2014138178 A1 | 9/2014 |
| WO | 2016004651 A1 | 1/2016 |

OTHER PUBLICATIONS

Lahoti et al., "Custer-centric Energy Usage Data Management and Sharing in Smart Grid Systems", Smart Energy Grid Security, ACM, 2013, 12 pages.

Samed et al., "Automated Demand Response for Smart Builidings and Microgrids: The State of the Practice and Research Challenges", Proceedings of the IEEE, New York, 2016, 19 pages.

International Preliminary Report on Patentability for Application No. PCT/US2019/044645, Filing Date: Aug. 1, 2019, dated Feb. 16, 2021, 7 pages.

* cited by examiner

GENERATION OF DEMAND RESPONSE EVENTS BASED ON GRID OPERATIONS AND FAULTS

BACKGROUND

The subject matter disclosed herein relates generally to managing systems, and more particularly to generating demand response events based on grid operations and faults.

In today's environment, power grids are used to transmit and distribute electric power for residential, commercial and industrial uses. Power is produced by facilities that use fossil fuel resources, or by distributed renewable sources like solar and wind generators. The power grids have a limited capacity of the power that can be produced and provided to its various customers. This limited capacity may result in outage events in the presence of failure or critical situations. For instance, if the energy demands exceed the available capacity, power outages can occur. In other scenarios, fossil fuel generators and equipment used for power generation can suffer failures or reduced performance which can further limit the capacity from the power grid, while in other cases the variability of weather conditions may threaten the availability of renewable resources, or unexpectedly increase their production. There may be a need to predict failures and faults of the power grid to mitigate its effects.

BRIEF SUMMARY

According to an embodiment, a computer-implemented method for generating demand response (DR) events based on grid operations and faults is shown. The computer-implemented method includes obtaining grid status information; determining a fault condition based at least in part on the grid status information; generating a DR event based at least in part on the fault condition; and responsive to generating the DR event, transmitting a notification of the DR event.

In addition to one or more of the features described herein, or as an alternative, further embodiments include grid status information such as current available capacity and energy production rate.

In addition to one or more of the features described herein, or as an alternative, further embodiments include predicting a fault, wherein predicting the fault includes aggregating energy management system (EMS) data from one or more EMS, comparing the aggregated EMS data and the grid data to predict the fault; generating a DR event responsive to the comparison, and transmitting a notification of the DR event to one or more systems.

In addition to one or more of the features described herein, or as an alternative, further embodiments include aggregated EMS data such as load profile information for each EMS, flexible resource information for each EMS, or supplemental energy sources for each EMS.

In addition to one or more of the features described herein, or as an alternative, further embodiments include notifications such as a request to modulate power consumption for a defined period of time to balance the load during the DR event.

In addition to one or more of the features described herein, or as an alternative, further embodiments include load profile information including historical energy usage information, weather information, or previous fault information.

In addition to one or more of the features described herein, or as an alternative, further embodiments include performing load balancing of one or more EMS based at least in part on the EMS data, the grid status, and a predicted fault.

According to a different embodiment, a system generating demand response (DR) events based on grid operations and faults is provided. The system includes a power grid, one or more energy management systems (EMS) system controllers, and an aggregator in communication with the power and the one or more EMS controllers. The aggregator is configured to obtain grid status information, determining a fault condition based at least in part on the grid status information, generate a DR event based at least in part on the fault condition, and responsive to generating the DR event, transmit a notification of the DR event.

In addition to one or more of the features described herein, or as an alternative, further embodiments include grid status information such as current available capacity and energy production rate.

In addition to one or more of the features described herein, or as an alternative, further embodiments include an aggregator that is further configured to aggregate EMS data from the one or more EMS, compare the aggregated EMS data and the grid data to predict the fault, generate a DR event responsive to the comparison, and transmit a notification of the DR event to one or more systems.

In addition to one or more of the features described herein, or as an alternative, further embodiments include aggregated EMS data such as load profile information for each EMS, flexible resource information for each EMS, or supplemental energy sources for each EMS.

In addition to one or more of the features described herein, or as an alternative, further embodiments include notifications including a request to modulate power consumption for a defined period of time to balance the load during the DR event.

In addition to one or more of the features described herein, or as an alternative, further embodiments include load profile information including historical energy usage information, weather information, or previous fault information.

In addition to one or more of the features described herein, or as an alternative, further embodiments include an aggregator that is further configured to perform load balancing of the one or more EMS based at least in part on the EMS data, the grid status, and a predicted fault.

According to another embodiment, an aggregator for generating demand response (DR) events based on grid operations is provided. The aggregator includes a communication module configured to communicate with one or more systems and a power grid, and a fault module configured to detect and predict a fault condition based at least in part on energy management system (EMS) data and the grid status information. The aggregator also includes a profile module configured to store load profile, flexible resource, grid production, a DR event module configured to generate a notification based on at least one of a fault or a predicted fault, and wherein the communication module is configured to transmit the DR event.

In addition to one or more of the features described herein, or as an alternative, further embodiments include grid status information such as current available capacity and energy production rate.

In addition to one or more of the features described herein, or as an alternative, further embodiments include an aggregator that is further configured to predict a fault, wherein predicting the fault includes aggregating energy management system (EMS) data from one or more EMS, comparing the aggregated EMS data and the grid data to predict the fault, generating a DR event responsive to the comparison, and transmitting a notification of the DR event to one or more systems.

In addition to one or more of the features described herein, or as an alternative, further embodiments include aggregated EMS data including at least one of load profile information for each EMS, flexible resource information for each EMS, or supplemental energy sources for each EMS.

In addition to one or more of the features described herein, or as an alternative, further embodiments include a notification including a request to modulate power consumption for a defined period of time to balance the load during the DR event.

In addition to one or more of the features described herein, or as an alternative, further embodiments include load profile information that includes at least one of historical energy usage information, weather information, or previous fault information.

The foregoing features and elements may be combined in various combinations without exclusivity unless expressly indicated otherwise. These features and elements, as well as the operation thereof, will become more apparent in light of the following description and the accompanying drawings. It should be understood, however, that the following description and drawings are intended to be illustrative and explanatory in nature and non-limiting.

BRIEF DESCRIPTION OF THE DRAWINGS

The present disclosure is illustrated by way of example and not limited in the accompanying figures in which like reference numerals indicate similar elements.

DETAILED DESCRIPTION

In demand-response (DR) systems, management of electric power usage by end-user customers can be employed to optimize the demand for electric power with the available supply. To avoid a scenario where the demand for power exceeds the available capacity, or scenarios in which the capacity exceeds the demand (e.g., overproduction of renewable sources) various management techniques have been employed. On the one hand, if the capacity is not able to satisfy the demand, current load balancing techniques simply manage the available capacity received from the energy generating source, and share it across the end-users with extreme situations of load shredding (i.e., blackout) when load requirements cannot be satisfied. On the other hand, if unexpected peaks of power are fed into the power grid, either renewable sources are disconnected from the grid, or consumers are incentive to consume more power. However, these techniques fail to predict faults or conditions that can lead to outages and also fail to prevent over or under-consumption of the available energy resources. There may be a need to intelligently predict fault conditions and reduce or increase energy consumption by flexible resources to mitigate the occurrence of power outages.

By introducing predictive fault capabilities for outage conditions in the power grid, the techniques described herein provide benefits through its capability to anticipate possible unwanted situations, and in some cases, even avoid that outages or blackouts conditions occur. Indeed, if a faulty condition is predicted, the aggregator is configured to coordinate the available flexible resources in order to cope with the upcoming situation. In this fashion, the overall quality of the power grids will be improved and the number of local outages can be significantly reduced.

Figure 1:
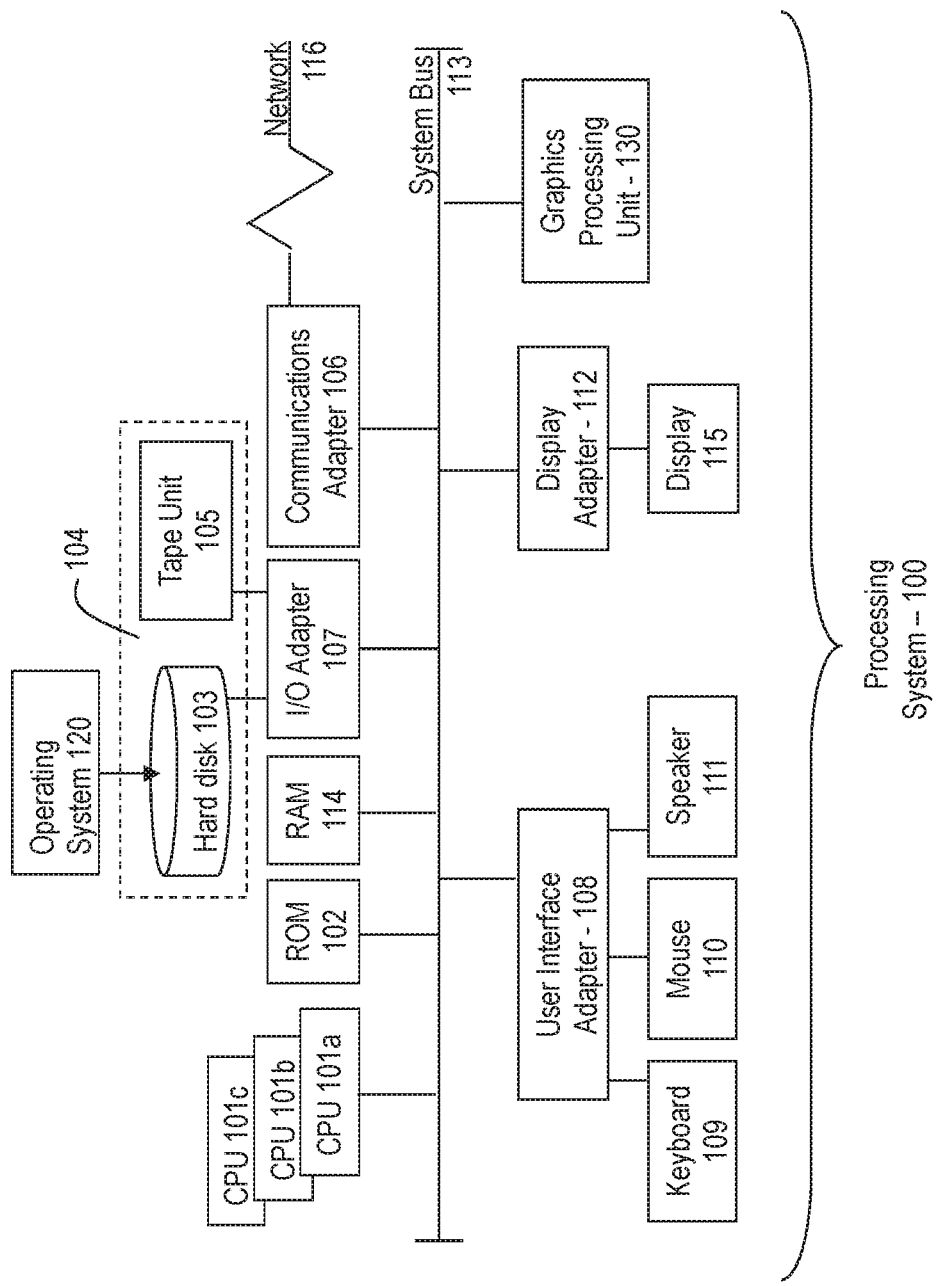
FIG. 1 depicts a system that may employ various embodiments of the present disclosure.

Referring to FIG. 1, there is shown an embodiment of a processing system 100 for implementing the teachings herein. In this embodiment, the system 100 has one or more central processing units (processors) 101a, 101b, 101c, etc. (collectively or generically referred to as processor(s) 101). In one embodiment, each processor 101 may include a reduced instruction set computer (RISC) microprocessor. Processors 101 are coupled to system memory 114 and various other components via a system bus 113. Read-only memory (ROM) 102 is coupled to the system bus 113 and may include a basic input/output system (BIOS), which controls certain basic functions of system 100.

FIG. 1 further depicts an input/output (I/O) adapter 107 and a network adapter 106 coupled to the system bus 113. I/O adapter 107 may be a small computer system interface (SCSI) adapter that communicates with a hard disk 103 and/or tape storage drive 105 or any other similar component. I/O adapter 107, hard disk 103, and tape storage device 105 are collectively referred to herein as mass storage 104. Operating system 120 for execution on the processing system 100 may be stored in mass storage 104. A network adapter 106 interconnects bus 113 with an outside network 116 enabling data processing system 100 to communicate with other such systems. A screen (e.g., a display monitor) 115 is connected to system bus 113 by display adaptor 112, which may include a graphics adapter to improve the performance of graphics intensive applications and a video controller. In other embodiments, one or more components can be implemented in an embedded device, such as in internet-of-things (IoT) devices. In addition, this can be deployed fully local or deployed partially local and enabled with IoT capabilities. Thus, video, graphics, reporting, etc. ca be performed and/or controlled remotely. In one embodiment, adapters 107, 106, and 112 may be connected to one or more I/O busses that are connected to system bus 113 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 113 via user interface adapter 108 and display adapter 112. A keyboard 109, mouse 110, and speaker 111 all interconnected to bus 113 via user interface adapter 108, which may include, for example, a Super I/O chip integrating multiple device adapters into a single integrated circuit.

In exemplary embodiments, the processing system 100 includes a graphics processing unit 130. Graphics processing unit 130 is a specialized electronic circuit designed to manipulate and alter memory to accelerate the creation of images in a frame buffer intended for output to a display. In general, graphics processing unit 130 is very efficient at manipulating computer graphics and image processing, and has a highly parallel structure that makes it more effective than general-purpose CPUs for algorithms where processing of large blocks of data is done in parallel.

Thus, as configured in FIG. 1, the system 100 includes processing capability in the form of processors 101, storage capability including system memory 114 and mass storage 104, input means such as keyboard 109 and mouse 110, and output capability including speaker 111 and display 115. In one embodiment, a portion of system memory 114 and mass storage 104 collectively store an operating system to coordinate the functions of the various components shown in FIG. 1.

Figure 2:
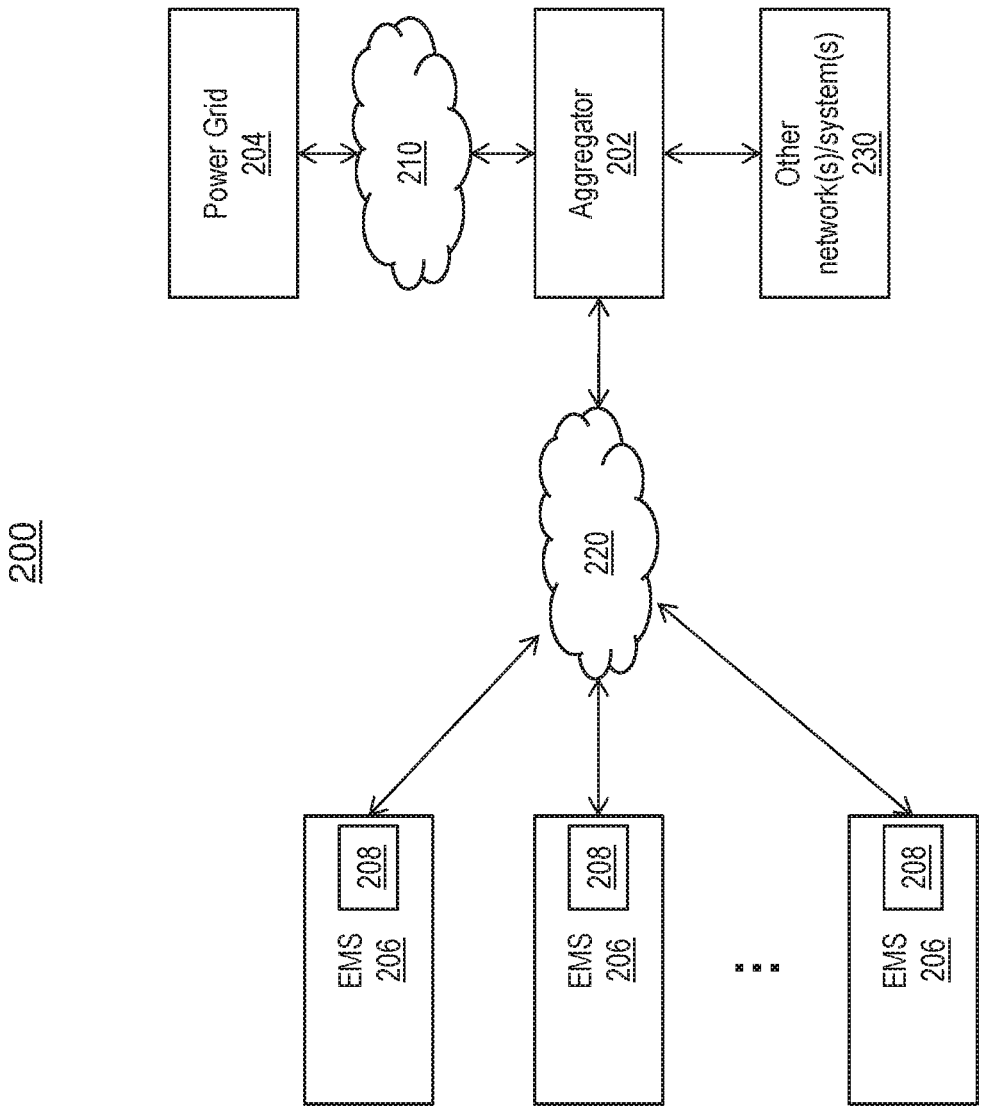
FIG. 2 depicts a system for generating demand-response (DR) events based on grid operations and faults in accordance with one or more embodiments.

Turning now to FIG. 2, a system 200 for generating DR events based on grid operations and faults in accordance with one or more embodiments is shown. The system 200 can be implemented in one or more elements of the system 100 provided in FIG. 1. As shown in FIG. 2, the system 200 includes an aggregator 202 that is in communication with a power grid 204 and one or more energy management systems (EMS) 206. The aggregator 202 is configured to communicate with the power grid 204 over a network 210 and multiple EMS 206 over network 220. In addition, the aggregator 202 is also configured to communicate with other networks/systems 230 either directly or indirectly over a network (not shown). The aggregator 202 is configured to communicate with controllers 208 of each EMS 206 that manage energy resource consumption and aggregate the data, individually and collectively, for each EMS 206 and is configured to compare the aggregated usage with the available capacity.

The EMS 206 includes a controller 208 to manage the resources that consume energy at a particular customer location. In the example case of commercial buildings, the energy consuming resources that are managed by EMS 206 can include HVAC systems, chiller systems, batteries, supplemental energy sources such as solar and wind. It is to be understood that other types of systems can be managed by the EMS 206 and are non-limiting in scope. The systems, equipment, and devices controlled by the EMS 206 can be classified as either a fixed type or a flexible type of resource. An example of fixed resources includes those energy resources that cannot modify their load consumption/production. Alternatively, an example of flexible resources includes those energy resources that are capable of modulating their power consumption/production within certain operational limits. In one or more embodiments, the resources can operate in a fixed/flexible mode based on various factors such as the time of day or current resources consumption. In other embodiments, the resources can have a priority or a percentage of availability that can be configured in a fixed/flexible mode. In some instances, the EMS 206 is coupled to systems that can supplement the energy supplied by the power grid 204. In this case, the EMS 206 can reduce or increase the energy resources taken from the power grid 204 to optimally load balance the available energy resources with the other EMS 206 in the system 200. The supplemental local energy sources include solar and wind energy-based sources. In other instances, the supplemental energy sources can include battery power or other stored energy source, on-site energy sources, or any other device that can be operated to generate or produce energy.

Figure 3:
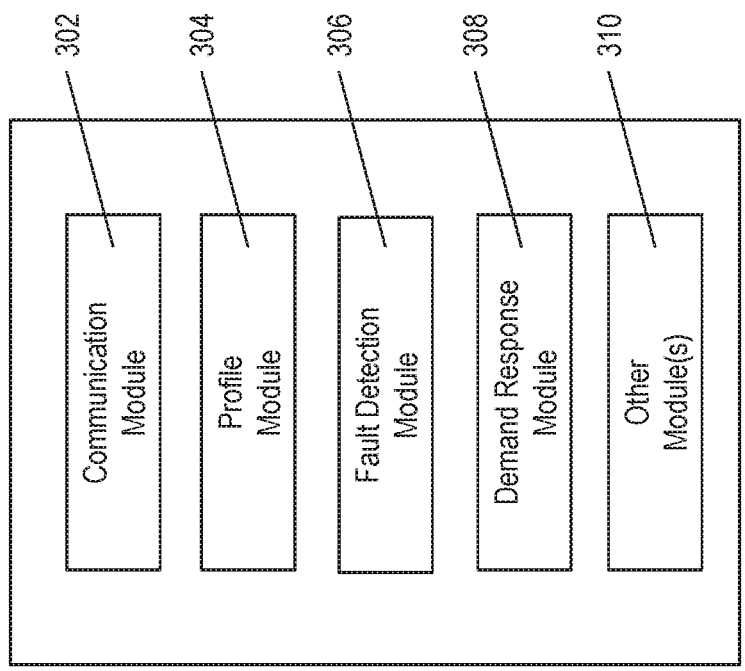
FIG. 3 depicts the modules and components that an aggregator can use for generating DR events based on grid operations and faults in accordance with one or more embodiments.

Turning now to FIG. 3, elements and modules associated with an aggregator 300 for generating DR events based on grid operations and faults in accordance with one or more embodiments is shown. In one or more embodiments, the aggregator 300 can be the aggregator 202 of FIG. 2. The aggregator 300 includes a communication module 302 that is configured to communicate with a power grid and multiple EMS systems. The communication protocol can include any suitable wired/wireless protocol to communicate either directly or indirectly over a network to the various devices and systems. In one example, the communication protocol can include an open automated demand-response (ADR) protocol. As shown in FIG. 3, the aggregator 300 also includes a profile module 304 that is configured to store load profile data such as periods of usage for a particular customers, historical trends, flexible resources, etc. In one or more embodiments, the aggregator 300 and/or system 200 can include an anonymizer module (not shown) to protect the identity of the customers. As data is collected and stored for each of the customers the anonymizer module is configured to store the data in a manner that hides or masks the identity of each customer.

A baseline or threshold limit for energy usage can be averaged over a period of time and compared to current usage for analysis. The aggregator 300 is configured to combine all of the usage data to predict how much capacity is available from the power grid. Based on the comparison it is determined if the total demand from each of the EMS is likely to exceed the total available capacity and cause a blackout. In this case, the aggregator 300 can send messages for each EMS to reduce their demand, for example, if the total demand is within 10% of the total capacity. In addition, the aggregator 300 can consider whether one of the EMS is over-consuming the energy resources compared to its historical usage patterns. In this case, the aggregator can transmit a message to the particular EMS to reduce its energy consumption or at least reduce its flexible consuming resources.

In other embodiments, in the event the aggregator 300 predicts (or it is noticed by the grid) an increase of renewable energy generation or some alternate source of energy, the power consumption for one or more EMS can be increased. The aggregator 300 can be configured to send messages to each EMS to increase the power consumption to utilize the excess or surplus amounts of power that was generated to avoid energy spikes.

The aggregator 300 also includes a fault detection module 306. Faults can include black-out or brown-out conditions where the demand exceeds the power supply. Faults can also include an overproduction of power where the power supply exceeds the demand which can lead to spikes in power generation. For example, renewable resources such as wind farms, which are weather dependent, can suddenly and unexpectedly increase the power that is generated and lead to fault conditions. In a non-limiting example, a fault at the power grid or supplemental energy sources can be communicated to the aggregator 300. In other non-limiting examples, the fault can be determined based on performing calculations to determine whether a capacity of the power grid or alternative energy sources has changed or whether an abnormal consumption at a load has occurred. In other embodiments, the fault detection module 306 is configured to predict whether an outage condition is likely to occur based on the power grid status and EMS status. In addition, the fault detection module 306 is configured to predict whether an overproduction condition is likely to occur based on renewable energy source status and the EMS/load status.

In the event a fault has been detected or predicted, the aggregator 300 includes a DR module 308 that is configured to generate a DR event to transmit to a controller at the load. In one or more embodiments, the aggregator 300 functions as a load manager to optimize the power usage from the grid. The aggregator 300 can instruct the load either to reduce/increase power consumption or completely stop power consumption for a period of time. In one or more embodiments, the EMS can instruct its high energy consuming loads to reduce its usage before disabling other lower energy consuming loads. In the event of overproduction of power, such as by the renewable energy sources and/or other energy sources, the aggregator 300 can instruct each EMS to increase their respective energy consumption to avoid spikes leading to fault conditions. In this example, a windfarm manager can be configured to stop all or part of the wind turbines. In one or more embodiments, the load power can be modulated to increase or decrease its demand based on the predicted fault condition.

The aggregator 300 as shown in FIG. 3 can also include another module(s) 310 such as additional hardware and/or software components to add functionality to the aggregator. Furthermore, it should be understood that other configurations and arrangements of the aggregator 300 can be implemented to manage the system such as the system 200 shown in FIG. 2.

Figure 4:
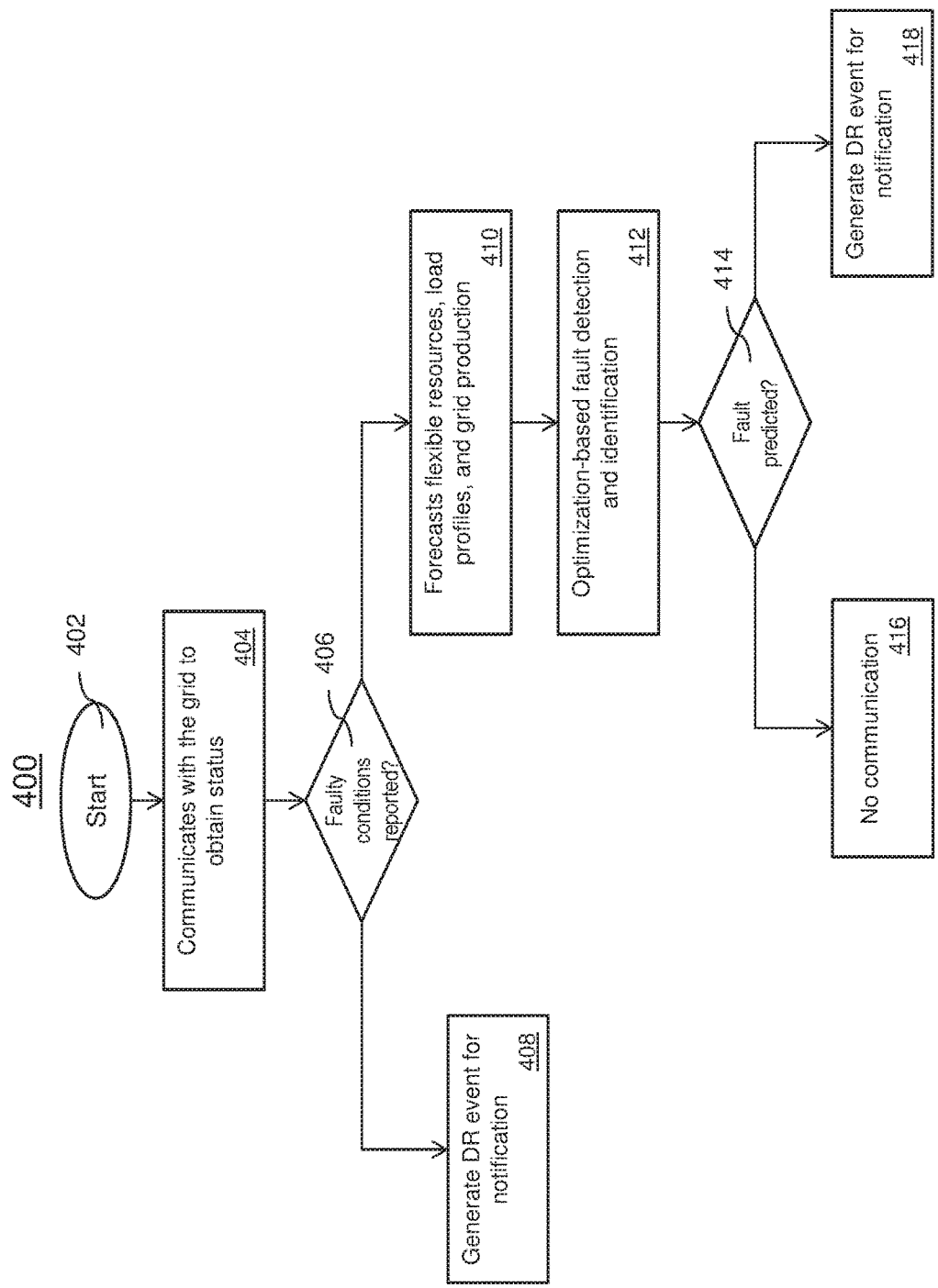
FIG. 4 depicts a flowchart of a method for generating DR events based on grid operations and faults in accordance with one or more embodiments.

Turning now to FIG. 4, a flowchart of a method 400 for generating DR events based on grid operations and faults in accordance with one or more embodiments is shown. It should be understood, the method 400 can be implemented in any of the systems shown in FIGS. 1-3. The method 400 begins at block 402 and proceeds to block 404 which provides for communicating with the grid to obtain the grid status. The aggregator is configured to collect status information for the power grid to determine the current operational performance and capacity.

At decision block 406, the method 400 determines whether a fault condition has been reported. The power grid can transmit an existing fault to the aggregator such as a failed generator which reduces the overall available capacity of the power grid. The power grid can also transmit an indication to the aggregator indicating a generator is operating at a reduced level which reduces the overall capacity. The power grid can also indicate if maintenance is to be performed taking a generator offline or any other indication that a change in the production rate of power is to occur. In addition, it is to be understood that any type of status information or message can be provided by the power grid can be processed and used in the method 400.

In the event a fault has been reported and/or determined, block 408 provides for the generation of the DR event for notification. Responsive to generating the DR event, the indication is transmitted to one or more EMS indicating that the capacity has been impacted and to reduce the consumption. In one or more embodiments, a single EMS may be tasked with reducing its local resource. In another embodiment, the plurality of EMS may be tasked with reducing its energy consumption in a load balancing manner. In some other embodiments, a negotiation phase among the plurality of EMS and the aggregator may be performed to determine which EMS or combination of EMS will be instructed to adjust their power to achieve a certain level of power reduction. Otherwise, at block 408, if no fault condition has been reported at block 410 the method 400 provides for forecasting flexible resources, load profiles, and grid production. In one or more embodiments, the flexible resources of each EMS can be stored at the aggregator.

The aggregator can also track weather information which can indicate if a storm or other condition that can impact the electric power supplied to each EMS. For example, a severe thunderstorm can take down power lines. High or low wind conditions can impact the production of energy using wind turbines. In another example, overcast or cloudy conditions can impact solar based energy production such as PV panels.

In addition, the load profiles for each EMS can be stored at the aggregator to track the usage over a period of time. The usage data can be used to identify trends from each EMS which can be further used to identify abnormal usage. The aggregator is also configured to store the current and historical power grid production rates and capacity.

At block 412, an optimization-based fault detection and identification is performed. In one or more embodiments, the aggregator is configured to analyze the combination of flexible resources, load profiles, and power grid production to determine whether a fault is likely to occur. The method 400 proceeds to the decision block 414 to determine whether a fault is predicted. In the event no fault is predicted, then, as shown at block 416, no communication is provided to the EMS. Otherwise, if a fault is predicted, block 418 provides for generating a DR event for notification to one or more EMS to modify its energy consumption. In one or more embodiments, the method 400 returns to block 404 and continues to communicate with the power grid to determine the status.

The technical effects and benefits include coordinating available flexible resources based on a predicted fault condition. The technical effects and benefits include improving the overall quality of the power grids and significantly reducing the probability of outages occurring due to reduced grid performance or over-consumption at the loads.

As described above, embodiments can be in the form of processor-implemented processes and devices for practicing those processes, such as a processor. Embodiments can also be in the form of computer program code containing instructions embodied in tangible media, such as network cloud storage, SD cards, flash drives, floppy diskettes, CD ROMs, hard drives, or any other computer-readable storage medium, wherein, when the computer program code is loaded into and executed by a computer, the computer becomes a device for practicing the embodiments. Embodiments can also be in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes a device for practicing the embodiments. When implemented on a general-purpose microprocessor, the computer program code segments configure the microprocessor to create specific logic circuits.

The term "about" is intended to include the degree of error associated with measurement of the particular quantity and/or manufacturing tolerances based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description but is only limited by the scope of the appended claims.

What is claimed is:

1. A computer-implemented method for generating demand response (DR) events based on grid operations and faults, the computer-implemented method comprising:
   obtaining grid status information;
   determining a fault condition based at least in part on the grid status information;
   generating a DR event based at least in part on the fault condition;
   responsive to generating the DR event, transmitting a notification of the DR event;
   predicting a fault, wherein predicting the fault comprises:
   aggregating energy management system (EMS) data from one or more EMS;
   comparing the aggregated EMS data and the grid data to predict the fault;
   generating a DR event responsive to the comparison; and
   transmitting a notification of the DR event to one or more systems;
   the method further comprising performing load balancing of one or more EMS based on the EMS data, the grid status, and a predicted fault.

2. The computer-implemented method of claim 1, wherein the grid status information comprises current available capacity and energy production rate.

3. The computer-implemented method of claim 1, wherein the aggregated EMS data comprises at least one of load profile information for each EMS, flexible resource information for each EMS, or supplemental energy sources for each EMS.

4. The computer-implemented method of claim 1, wherein the notification comprises a request to modulate power consumption for a defined period of time to balance the load during the DR event.

5. The computer-implemented method of claim 3, wherein the load profile information comprises at least one of historical energy usage information, weather information, or previous fault information.

6. A system generating demand response (DR) events based on grid operations and faults, the system comprising:
   a power grid;
   one or more energy management systems (EMS) system controllers;
   an aggregator in communication with the power and the one or more EMS controllers, wherein the aggregator is configured to:
   obtain grid status information;
   determining a fault condition based at least in part on the grid status information;
   generate a DR event based at least in part on the fault condition;
   responsive to generating the DR event, transmit a notification of the DR event;
   predict a fault, wherein predicting the fault comprises:
   aggregating energy management system (EMS) data from one or more EMS;
   comparing the aggregated EMS data and the grid data to predict the fault;
   generating a DR event responsive to the comparison; and
   transmitting a notification of the DR event to one or more systems;
   wherein the aggregator is configured to perform load balancing of one or more EMS based on the EMS data, the grid status, and a predicted fault.

7. The system of claim 6, wherein the grid status information comprises current available capacity and energy production rate.

8. The system of claim 6, wherein the aggregated EMS data comprises at least one of load profile information for each EMS, flexible resource information for each EMS, or supplemental energy sources for each EMS.

9. The system of claim 6, wherein the notification comprises a request to modulate power consumption for a defined period of time to balance the load during the DR event.

10. The system of claim 8, wherein the load profile information comprises at least one of historical energy usage information, weather information, or previous fault information.

* * * * *